(12) United States Patent
Kim et al.

(10) Patent No.: US 8,513,987 B1
(45) Date of Patent: Aug. 20, 2013

(54) WIDE FREQUENCY RANGE SIGNAL GENERATOR USING A MULTIPHASE FREQUENCY DIVIDER

(75) Inventors: Heung S. Kim, San Jose, CA (US); Kenneth J. Evans, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 46 days.

(21) Appl. No.: 13/273,968

(22) Filed: Oct. 14, 2011

Related U.S. Application Data

(60) Provisional application No. 61/432,442, filed on Jan. 13, 2011.

(51) Int. Cl.
*H03K 21/00* (2006.01)

(52) U.S. Cl.
USPC .......................................... 327/115; 327/117

(58) Field of Classification Search
USPC ................. 327/124, 291, 295, 299, 113, 115, 327/117
See application file for complete search history.

(56) References Cited

U.S. PATENT DOCUMENTS

| 7,181,180 B1 * | 2/2007 | Teo et al. ...................... 455/260 |
| 7,427,883 B1 * | 9/2008 | Cheng ........................... 327/156 |
| 8,081,017 B2 * | 12/2011 | Shibayama et al. .......... 327/115 |

* cited by examiner

*Primary Examiner* — Hai L Nguyen
(74) *Attorney, Agent, or Firm* — Van Pelt, Yi & James LLP

(57) ABSTRACT

In a high frequency mode a multiphase voltage-controlled oscillator (VCO) generates a first plurality of signals where each has the desired frequency and a different phase. A phase interpolator generates the signal at the desired frequency and the desired phase using a first plurality of signals. In a low frequency mode the VCO generates a second plurality of signals where each has a frequency which is a multiple of the desired frequency and a different phase. A multiphase frequency divider generates a third plurality of signals by dividing the frequency of the second plurality to the desired frequency while maintaining a phase relationship with the second plurality of signals. The phase interpolator generates the signal at the desired frequency and the desired phase using the third plurality.

24 Claims, 11 Drawing Sheets

WIDE FREQUENCY RANGE SIGNAL GENERATOR USING A MULTIPHASE FREQUENCY DIVIDER

CROSS REFERENCE TO OTHER APPLICATIONS

This application claims priority to U.S. Provisional Patent Application No. 61/432,442 entitled WIDE FREQUENCY RANGE PHASE INTERPOLATOR USING A MULTIPHASE DIVIDER filed Jan. 13, 2011 which is incorporated herein by reference for all purposes.

BACKGROUND OF THE INVENTION

Generating a clock with a desired frequency and a desired phase tends to be easier when the frequency range of operation is narrower. When a relatively wide frequency range of operation is desired (e.g., on the order of hundreds of MHz), it is difficult to generate a good quality clock over the entire range. FIG. 1 shows an example of a system to generate a clock having a desired phase and desired frequency over a relatively wide frequency range. In the example shown, there is a low frequency path (100) and a high frequency path (102), each of which includes a multiphase voltage-controlled oscillator (VCO) and a phase interpolator. Each multiphase VCO generates multiple signals, each at the desired frequency but with various phases. The phase interpolator takes these signals as inputs and generates a single signal with the desired frequency and desired phase. Using a low frequency path and a high frequency path as shown, the components in each path can be "tuned" or otherwise configured to operate over the particular frequency range with the desired performance characteristics or properties (e.g., with respect to ringing or lack thereof, rise/fall times, a desired load capable of being driven by a generated clock signal, etc.).

Although the example of FIG. 1 is able to generate a clock over a relatively wide frequency range of operation, it may be desirable to reduce the amount of circuitry used. For example, some systems may require multiple clocks to be generated and multiple instances of the clock generation system shown may be included in an application-specific integrated circuit (ASIC), field-programmable gate array (FPGA), system with an embedded microprocessor or other system. Reducing circuitry (e.g., in an ASIC) reduces power consumption as well as die size (and cost corresponds to die size). It would therefore be desirable if new techniques for signal generation over a wide frequency range of operation could be developed which require less circuitry.

BRIEF DESCRIPTION OF THE DRAWINGS

Various embodiments of the invention are disclosed in the following detailed description and the accompanying drawings.

DETAILED DESCRIPTION

Figure 1:
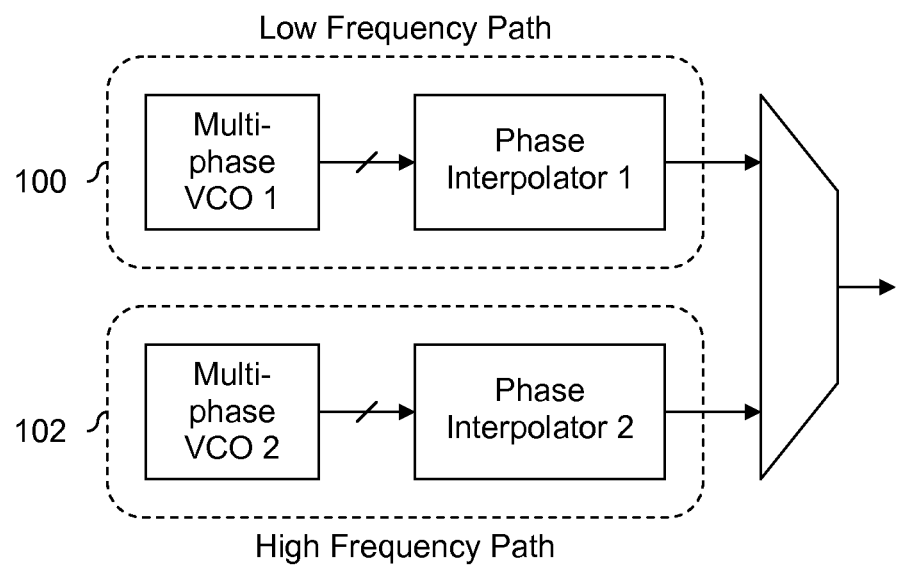
FIG. 1 shows an example of a system to generate a clock having a desired phase and desired frequency over a relatively wide frequency range.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

What is described herein is a technique for generating a signal having a desired frequency and a desired phase. For high frequencies, the signal is generated using a multiphase voltage-controlled oscillator (VCO) and a phase interpolator. The multiphase VCO generates multiple signals, each of which is at the desired frequency but at different phases. The phase interpolator takes these signals and generates the signal at the desired frequency and the desired phase. For low frequencies, the signal is generated using a multiphase VCO and a phase interpolator (e.g., the same ones used to generate high frequency signals), as well as a multiphase frequency divider. The multiphase VCO generates multiple signals, each at a frequency that is a multiple of the desired frequency and at various phases. The multiphase frequency divider divides down the signals to a frequency that is the desired frequency while maintaining the phase relationship of the signals (e.g., maintaining an equal spacing in the phase domain). These frequency-divided signals are then used by the multiphase phase interpolator to generate a signal at the desired frequency and desired phase. In some embodiments, there is some compensation or adjustment to at least some components when using a multiphase frequency divider in a low frequency mode.

Figure 2:
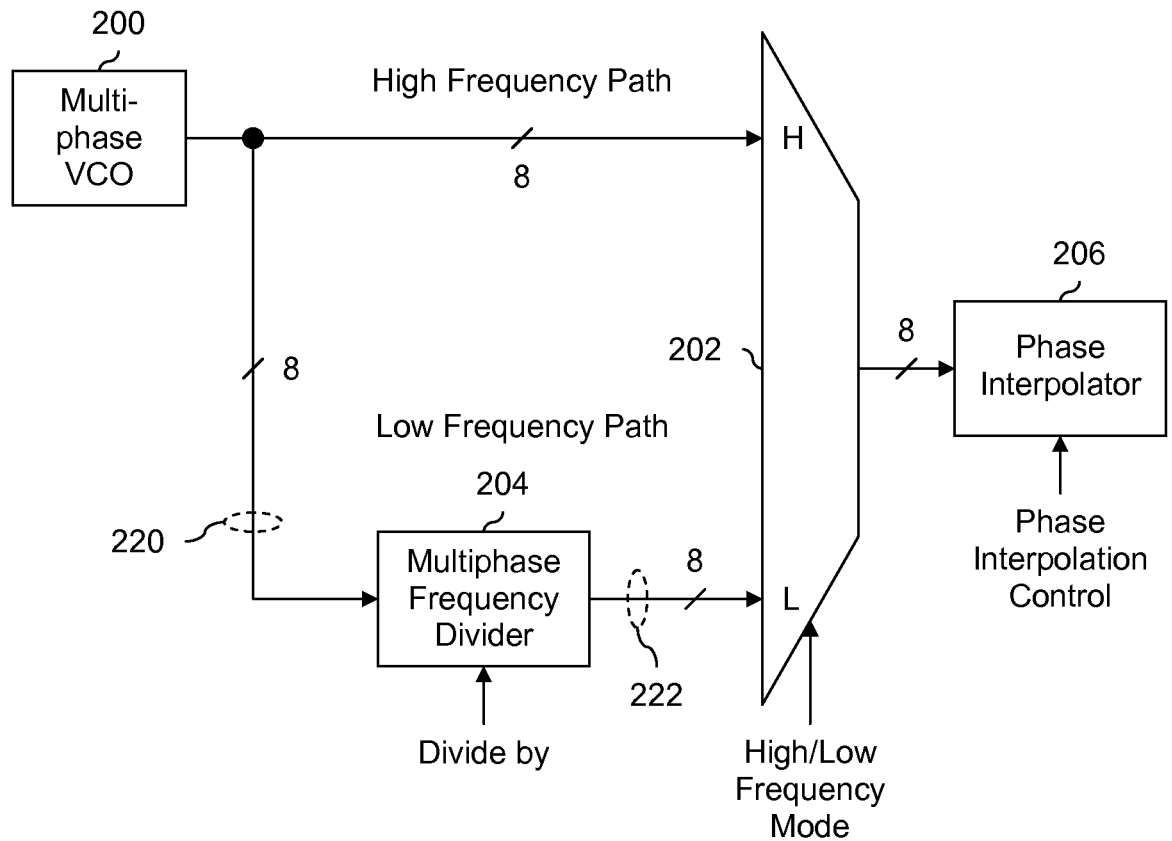
FIG. 2 is a diagram showing an embodiment of a system to generate a clock over a relatively wide frequency range.

FIG. 2 is a diagram showing an embodiment of a system to generate a clock over a relatively wide frequency range. In the example shown, multiphase voltage-controlled oscillator (VCO) 200 outputs 8 signals, each of which is at the desired frequency but at different phases (e.g., 0, π/4, π/2, ..., 5π/4, 3π/2 and 7π/4). The frequency of the signals output by multiphase VCO 200 is controlled by a control signal passed to multiphase VCO 200 and depends both upon the desired frequency of the clock and whether the system is operating in a high frequency mode or a low frequency mode. For example, if a threshold for operating in a high frequency mode ($f_{threshold}$) is 5 GHz and a desired frequency ($f_{desired}$) is 7 GHz, then the system would operate in the high frequency mode since $f_{desired} > f_{threshold}$. If $f_{desired} < f_{threshold}$ then the system operates in the low frequency mode of operation in such embodiments.

During a high frequency mode of operation, multiphase VCO 200 is configured to generate signals at the desired frequency. For the example $f_{desired} = 7$ GHz, the control to multiphase VCO 200 is set to a value such that 8 signals at 7 GHz and various phases are generated.

The select pin of multiplexer 202 is configured during a high frequency mode of operation to pass the 8 signals (e.g., at 7 GHz) from multiphase VCO 200 to phase interpolator 206, which generates a single signal at the desired frequency and desired phase ($\theta_{desired}$). In some embodiments, phase interpolator 206 does this by selecting the two signals with the two phases adjacent to the desired phase, then combining those two signals to obtain the desired phase and desired frequency. In some embodiments, this is done using a weighted average of the two signals. In some cases, no phase interpolation is required because one of the phases passed to phase interpolator 206 matches the desired phase. In such cases, that input may be passed to the output of phase interpolator 206 (e.g., without modification).

During a low frequency mode of operation, the path through multiphase frequency divider 204 is selected by multiplexer 202. In this mode of operation, the 8 signals output by multiphase VCO 200 are not at the desired frequency, but rather are at some (e.g., integer) multiple of the desired frequency. For example, if $f_{desired} = 1$ GHz, then the signals output by multiphase VCO 200 may be at 2 GHz or 4 GHz. Whereas during a high frequency mode of operation, multiphase VCO 200 is the one to generate the signals at the desired frequency, during a low frequency mode of operation, the signals output by multiphase frequency divider 204 are the ones at the desired frequency.

Multiphase frequency divider 204 takes the 8 signals and divides them down by a specified divisor to the desired frequency. For example, multiphase frequency divider 204 may be able to perform a divide by 2 or divide by 4, and a control signal indicates which division to perform. When performing frequency division, multiphase frequency divider 204 ensures that the phase relationships of the input signals are maintained in the output signals. In one example, if the 8 signals coming in have phases of 0, π/4, π/2, ..., 5π/4, 3π/2 and 7π/4, the 8 signals output by multiphase frequency divider 204 have phases of 0, π/4, π/2, ..., 5π/4, 3π/2 and 7π/4. In another example, the 8 signals coming in have phases of 0, π/4, π/2, ..., 5π/4, 3π/2 and 7π/4 and the 8 signals coming out have phases of π/8, 3π/8, ..., 11π/4, 13π/8 and 15π/8.

During the low frequency mode of operation, the select pin of multiplexer 202 is set such that the signals generated by multiphase frequency divider 204 are passed to phase interpolator 206. Phase interpolator 206 operates the same during a high frequency mode as during a low frequency mode and generates a signal with the desired phase and desired frequency (e.g., by selecting the two signals with the closest phases and combining them if needed, or by selecting the signal that matches the desired phase).

The example system shown herein may be used in a variety of applications. In some embodiments, the system is used to generate a clock signal, for example for a hard disk drive system or other storage system. Such storage systems require read and write clocks and the generated signal may be used as such. Some other example applications include clocks for transceivers. For example, wireless devices need transmit and receive clocks in order to properly transmit and receive data packets.

Although this and other examples described herein may show a certain configuration or number of elements (e.g., multiphase VCO 220 outputs 8 signals at 8 phase offsets, multiphase frequency divider 204 performs divide by 2 as well as divide by 4, etc.), the techniques are applicable to any configuration and are not limited by the examples shown herein.

Figure 3:
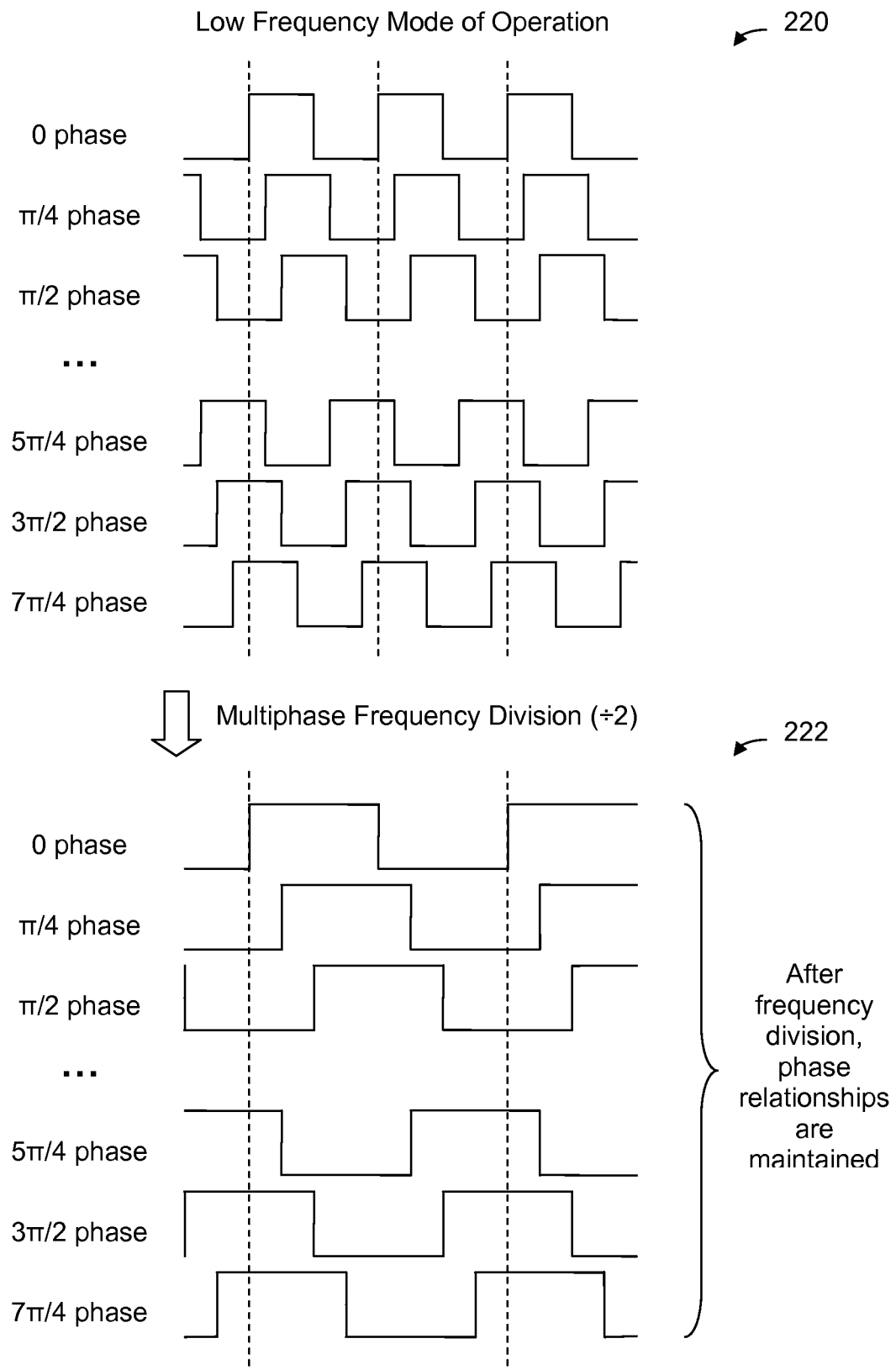
FIG. 3 is a waveform showing an embodiment of signals input to and output by a multiphase frequency divider during a low frequency mode of operation.

FIG. 3 is a waveform showing an embodiment of signals input to and output by a multiphase frequency divider during a low frequency mode of operation. Signals 220 and 222 show examples of the signals input to and output by multiphase frequency divider 204 from FIG. 2. In some embodiments, a different set of signals, frequencies and/or phases is input and/or output.

In diagram 220, the 8 signals are all at the same frequency with various phases. In this example, the phases are equally spaced so that the signals have phases of 0, π/4, π/2, 3π/4, π, 5π/4, 3π/2 and 7π/4. The frequency of the signals in diagram 220 is two times that of the desired frequency, so that after frequency division all of the signals are at the desired frequency.

Diagram 222 shows example signals output by a multiphase frequency divider. In this example, a divide by 2 has been performed so that the period has doubled. Also, the phase relationships are maintained so that even though the period has doubled, the signals remain equally spaced at π/4 phase intervals. Although this example shows the same phases before and after multiphase frequency division (i.e., 0, π/4, ..., 3π/2 and 7π/4), in some embodiments there are different sets of phases before and after division (e.g., 0, π/2, π and 3π/2 before division and π/4, 3π/4, 5π/4 and 7π/4 after division). One example circuit capable of perform frequency division while maintaining phase relationships is described in another figure below.

Figure 4:
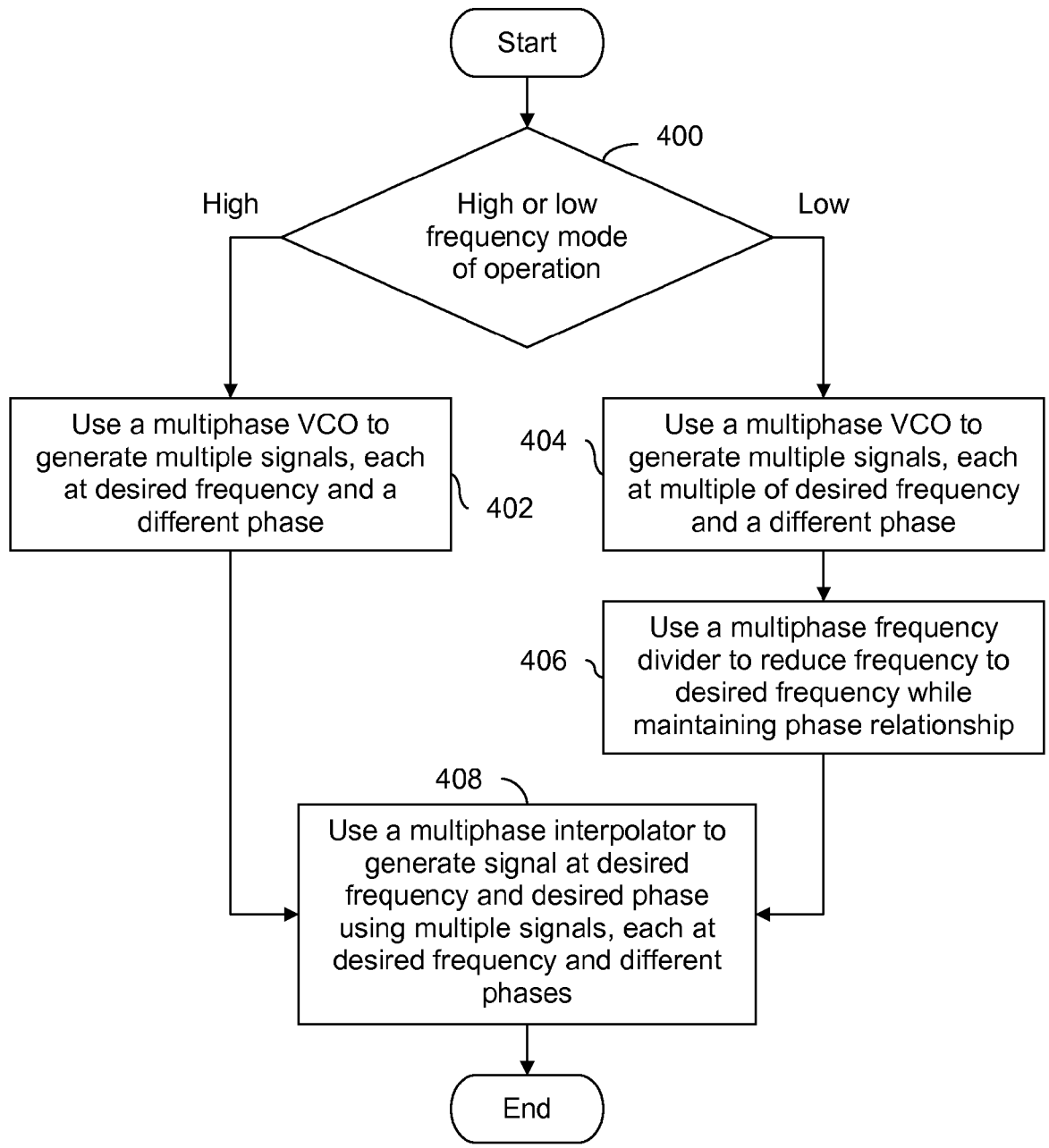
FIG. 4 is a flowchart illustrating an embodiment of a process for generating a clock over a relatively wide frequency range.

FIG. 4 is a flowchart illustrating an embodiment of a process for generating a clock over a relatively wide frequency range. At 400, it is determined whether to operate in a high frequency mode of operation or a low frequency mode of operation. For example, the desired frequency may be compared against a threshold and if the desired frequency is higher (lower) than the threshold then the system will operate in the high (low) frequency mode of operation. In some embodiments, a lookup table is accessed at 400 and is used to determine what mode to operate in. This may be desirable since a threshold comparison may not be sufficient in all cases. For example, because of certain performance characteristics, it may be desirable to operate in a high frequency mode of operation for desired frequencies between $f_1$ and $f_2$ as well as $f_3$ and $f_4$ and it may be easier to represent this in a lookup table. A lookup table may also offer more system flexibility, as it can be configured and reconfigured on the fly. In various embodiments, various considerations taken into account in deciding what mode to operate in include: power consumption, noise, characteristics or qualities of the signal produced, system configurations (e.g., the division(s) capable of being performed by a particular multiphase frequency divider), etc. In some embodiments, such a lookup table is also used to store configuration information for various desired frequencies when operation in a low frequency mode of operation, such as: the frequency of the signal generated by a multiphase VCO (e.g., what control values to pass to the VCO) for a particular desired frequency and/or the division to be performed by a multiphase frequency divider (e.g., divide by 2 vs. divide by 4) for that desired frequency.

If it is decided to operate in a high frequency mode of operation at 400, a multiphase VCO is used to generate multiple signals, each at the desired frequency and a different phase at 402. For example, if two signals are produced by a VCO then the first signal has a frequency of $f_{desired}$ with a phase of $\theta_1$ and the second signal has a frequency of $f_{desired}$ with a phase of $\theta_2$ where $\theta_1 \neq \theta_2$. In some cases, the phases are equally spaced.

If it is decided to operate in a low frequency mode of operation at 400, at 404 a multiphase VCO is used to generate multiple signals, each at a multiple of a desired frequency and a different phase. For example, if two signals are produced by a VCO then the first signal has a frequency of $k \times f_{desired}$ with a phase of $\theta_1$ and the second signal has a frequency of $k \times f_{desired}$ with a phase of $\theta_2$ where k is an integer and $\theta_1 \neq \theta_2$. As at 402, the phases of the signals generated at 404 are in some embodiments equally spaced.

In the low frequency mode of operation, a multiphase frequency divider is used to reduce the frequency to the desired frequency while maintaining phase relationships at 406. FIG. 3 shows one example where a divide by 2 is performed and the phase relationships (in that example at $\pi/4$ intervals) are maintained even after frequency division. One example of a multiphase frequency divider is described in further detail below.

After use of a multiphase frequency divider at 406 during a low frequency mode of operation, or after use of a multiphase VCO at 402 in a high frequency mode of operation, a phase interpolator is used to generate a signal at the desired frequency and desired phase using the multiple signals, each at the desired frequency and different phases at 408. In the low frequency mode of operation, the signals come from the multiphase frequency divider whereas in the high frequency mode of operation, the signals come from the multiphase VCO. An example of a phase interpolator is described in further detail below.

Figure 5:
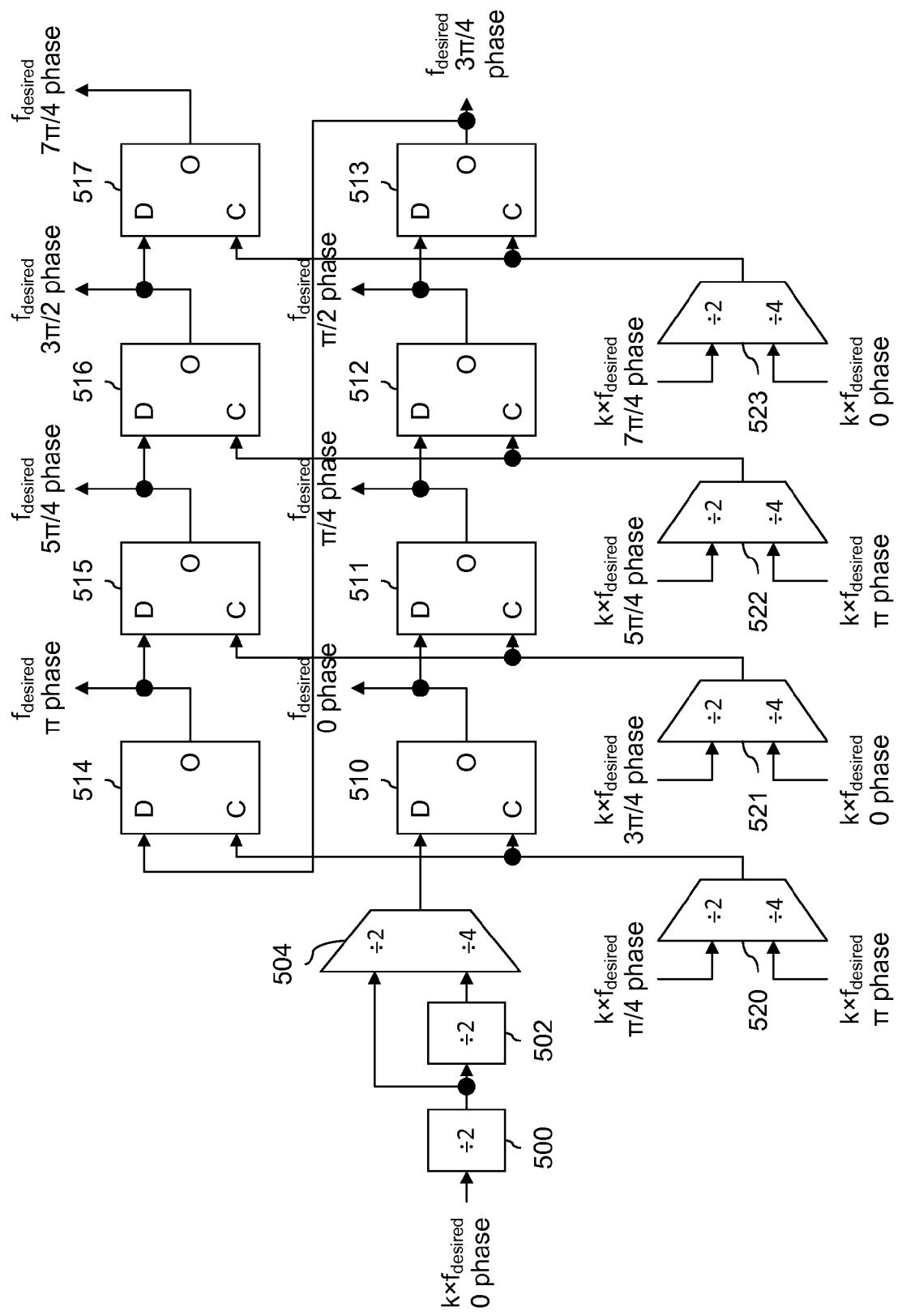
FIG. 5 is a diagram showing an embodiment of a multiphase frequency divider.

FIG. 5 is a diagram showing an embodiment of a multiphase frequency divider. In some embodiments, multiphase frequency divider 204 in FIG. 2 is implemented as shown. Any divider capable of performing frequency division while maintaining the phase relationships of the signals may be used and the technique is not limited to this particular divider.

In this example, the multiphase frequency divider is capable of performing a divide by 2 or a divide by 4. As described above, in some embodiments, a lookup table is used to determine what frequency division to perform and what frequencies generated by a multiphase VCO. In one example, $f_{desired}=1$ GHz and a divide by 4 is performed on a 0 phase signal having a frequency of 4 GHz. In some cases, $f_{desired}=1$ GHz but a 0 phase signal input to divider 500 has a frequency of 2 GHz and a divide by 2 is performed.

A zero phase signal at a frequency of $k \times f_{desired}$ is passed to divider 500 which divides the frequency in half. The output from divider 500 is passed to divider 502, as well as to an input of multiplexer 504. When the multiphase frequency divider performs a divide by 2, multiplexer 504 is configured to pass on the output of divider 500. When the multiphase frequency divider performs a divide by 4, multiplexer 504 is configured to pass on the output of divider 502.

To generate (at least in this example) the 8 signals having phases of 0, $\pi/4$, $\pi/2$, $3\pi/4$, $\pi$, $5\pi/4$, $3\pi/2$ and $7\pi/4$, an array of flip flops is used. The input to the first flip flop (510) is the output of multiplexer 504. The output of each flip flop is connected to the input of the next flip flop in the array (e.g., the output of flip flop 510 to the input of flip flop 511, the output of flip flop 511 to the input of flip flop 512 and so on). Each flip flop in the array generates a signal at the desired frequency and at one of the phases. The output of flip flop 510, for example, generates a signal with a frequency of $f_{desired}$ and a phase of 0, the output of flip flop 511 generates a signal with a frequency of $f_{desired}$ and a phase of $\pi/4$ and so on.

The clocks to each of the flip flops are selected based on the frequency division performed. When a divide by 2 is performed, multiplexer 520 passes a $\pi/4$ phase signal at $k \times f_{desired}$ frequency (e.g., input to a multiphase frequency divider by a multiphase VCO) to flip flops 510 and 514. Similarly, multiplexers 521-523 pass signals at $k \times f_{desired}$ frequency and at $\pi 3/4$ phase, $\pi 5/4$ phase and $\pi 7/4$ phase (respectively) to flip flop pair 511, 512 and 513, flip flop pair 515, 516 and 517 (respectively). During a divide by 4, multiplexers 520-523 pass on signals at $k \times f_{desired}$ frequency and $\pi$ phase, 0 phase, $\pi$ phase and 0 phase (respectively) to clock inputs of their corresponding flip flops.

The phases of the clock signals passed to flip flops 510-517 (e.g., using multiplexers 520-523) are selected (at least in this example) with timing constraints taken into consideration. Whenever flip flops (such as flip flops 510-517) are used, timing constraints must be checked and satisfied prior to fabrication (e.g., of an ASIC) so that the input (i.e., the D pin) is "settled" when a flip flop samples it at the rising edge of the clock (i.e., the C pin), typically with some margin in case the rising edge of the clock is early. If timing is not satisfied, the logic may not perform as designed. The configuration of clock inputs to the flip flops shown mitigates timing issues associated with setup and/or hold and may be attractive for this reason.

In the example shown, the clocks to the flip flops are selected based on two considerations. First, the timing relation between the $k \times f_{desired}$ 0 phase (input to divider 500) and the $k \times f_{desired}$ $\pi/4$ phase (÷2 case) or $k \times f_{desired}$ $\pi$ phase (÷4 case) needs to meet a setup and a hold timing requirement at 510 flip flop 510's D and C inputs. The D data input is delayed from $k \times f_{desired}$ and the C input is delayed from the $k \times f_{desired}$ $\pi/4$ (÷2 case) or the $k \times f_{desired}$ $\pi$(÷4 case). Second, the phases for 520-523 are decided by the frequency divided ratio. In this example, they are equally separated by ($\pi/4 \times 2 = \pi/2$) for the ÷2 case or ($\pi/4 \times 4 = \pi$) for the ÷4 case.

Figure 6:
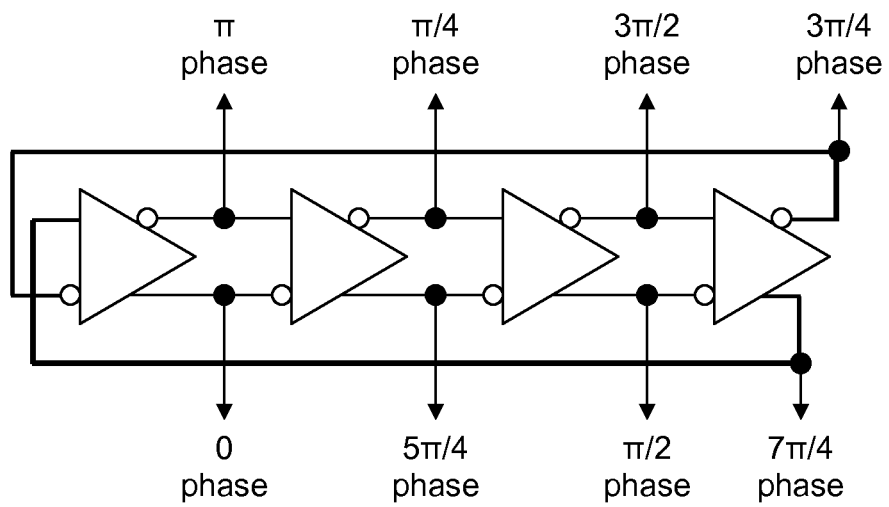
FIG. 6 is a diagram showing an embodiment of a multiphase VCO configured to generate 8 signals at $\pi/4$ phase intervals.

FIG. 6 is a diagram showing an embodiment of a multiphase VCO configured to generate 8 signals at $\pi/4$ phase intervals. In some embodiments, multiphase VCO 200 in FIG. 2 is implemented as shown. To adjust the frequency of the signals generated, the voltage applied to the buffers is increased or decreased as needed which causes the frequency of the signals generated to increase/decrease.

Figure 7:
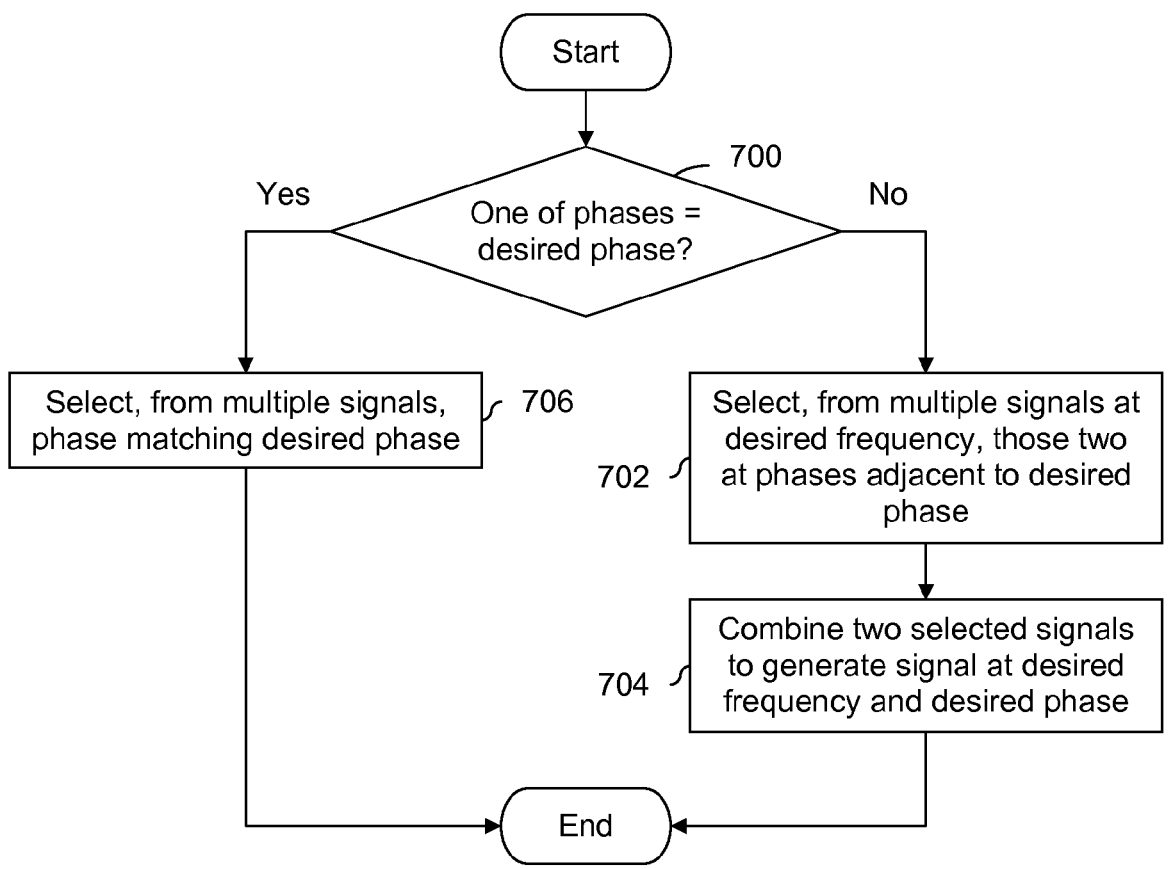
FIG. 7 is a flowchart illustrating an embodiment of a process for performing phase interpolation.

FIG. 7 is a flowchart illustrating an embodiment of a process for performing phase interpolation. In some embodiments, the process is performed by phase interpolator 206 in FIG. 2 to generate a signal at a desired phase using the 8 signals input to it. It is determined at 700 whether one of the phases is the desired phase. If so, the phase matching the desired phase is selected from the multiple signals at 706. For example, if the phases input to a phase interpolator are 0, π/2, π, and 3π/2 and the desired phase is π, then the signal at π phase is selected. If none of the phases is at the desired phase, then at 702 those two signals at phases adjacent to a desired phase are selected from the multiple signals at the desired frequency. For example, if the phases input to a phase interpolator are 0, π/4, π/2, 3π/4, π, 5π/4, 3π/2 and 7π/4 and the desired phase is n/8 then the signals at 0 phase and π/4 phase are selected. The two selected signals are combined to generate a signal at a desired frequency and a desired phase at 704. For example, the signals are combined using a weighted average.

The following figure shows one example of a phase interpolator.

Figure 8:
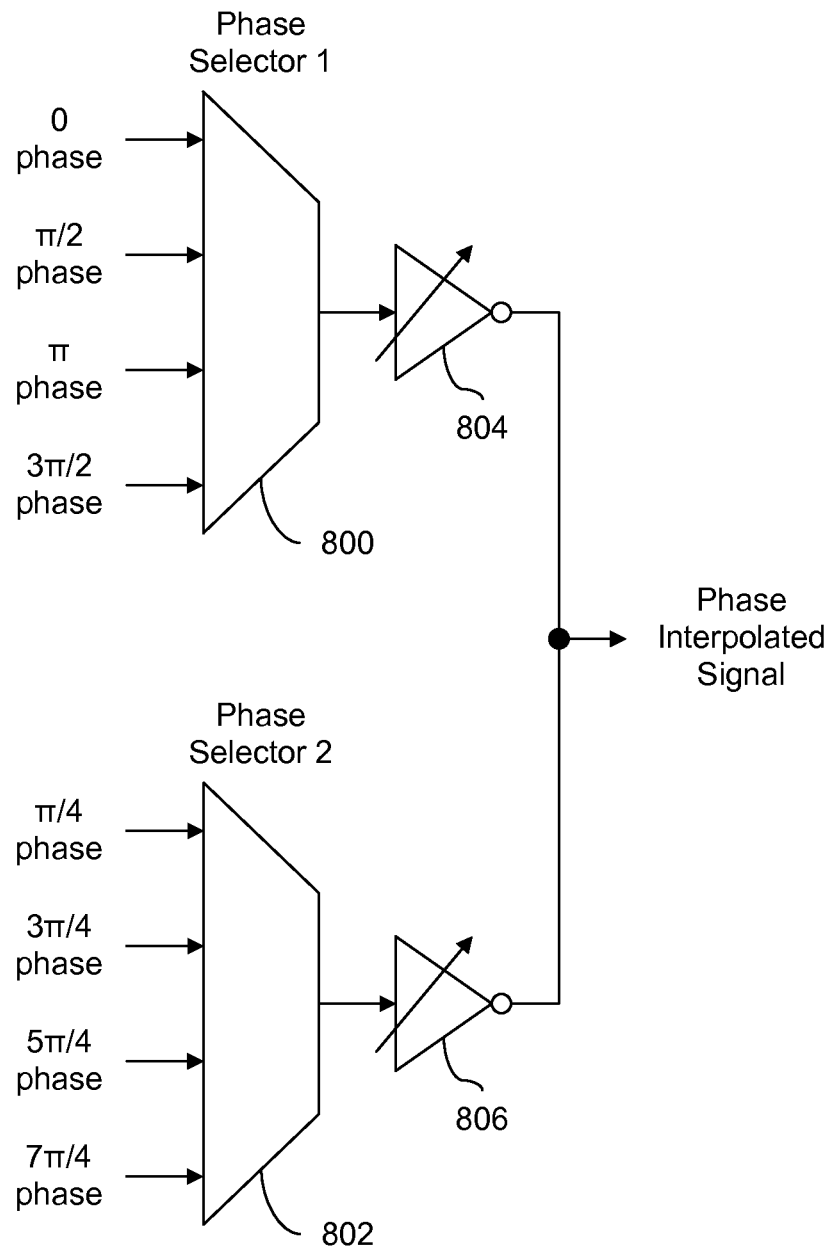
FIG. 8 is a diagram showing an embodiment of an 8-input phase interpolator.

FIG. 8 is a diagram showing an embodiment of an 8-input phase interpolator. In some embodiments, phase interpolator 206 in FIG. 2 is implemented as shown. Phase selectors 800 and 802 are used to select those two signals at the phases adjacent to a desired phase. For example, if the desired phase is π/8 then the 0 phase signal is selected by phase selector 800 and the π/4 phase signal is selected by phase selector 802. The inputs of buffers 804 and 806 are connected to the outputs of phase selectors 800 and 802, respectively, and the outputs of buffers 804 and 806 are tied together. Buffers 804 and 806 are adjustable and are set to appropriate strengths to mix the signals selected by phase selectors 800 and 802. Continuing the example of a desired phase of π/8, the strengths of buffers 804 and 806 are set to equal strengths so that the signals at 0 phase and π/8 phase are mixed in equal amounts.

In some embodiments, a user specifies a desired phase using a plurality of bits and the most significant bits are passed to phase selectors 800 and 802 as a "coarse select" signal and the least significant bits are passed to buffers 804 and 806 as a "fine select" signal and are used to set appropriate weights of buffers 804 and 806. In some embodiments, the number of signals input to a phase interpolator differs from the number of possible interpolated phases between any 2 adjacent phases input to a phase interpolator. For example, there may be 8 phases input to a phase interpolator, but the number of phase interpolation select bits permits for only 3 interpolated phases between any two adjacent phases (e.g., π/16, π/8 and 3π/16 are able to be interpolated between the phases of 0 and π/4).

Referring back to FIG. 2, in some applications, it is desirable to adjust the configuration of at least some of the components in a signal generation system for certain modes. For example, to ensure desired performance characteristics of phase interpolator 206 (such as phase step linearity) the speed (e.g., as measured by the rising/falling edge) of blenders in a phase interpolator (such as buffers 804 and 806 in FIG. 8) must generally match the input speed to the phase interpolator. Put another way, it may be desirable to reduce the bandwidth of a phase interpolator for a low frequency mode of operation to ensure that the phases capable of being interpolated between two adjacent input phases are relatively equidistant. It would not be useful, for example, if the phases capable of being interpolated were clustered tightly together (e.g., being able to generate phases of only 0.471, 0.489 and 0.494 between the phases of 0 and π/4—which is approximately 0.785—would not be as useful as being able to generate phases of 0.196, 0.393 and 0.589). The following figures show some embodiments for adjusting the configuration of a phase interpolator during a low frequency mode of operation to mitigate or otherwise reduce phase step non-linearity in interpolated phases.

Figure 9:
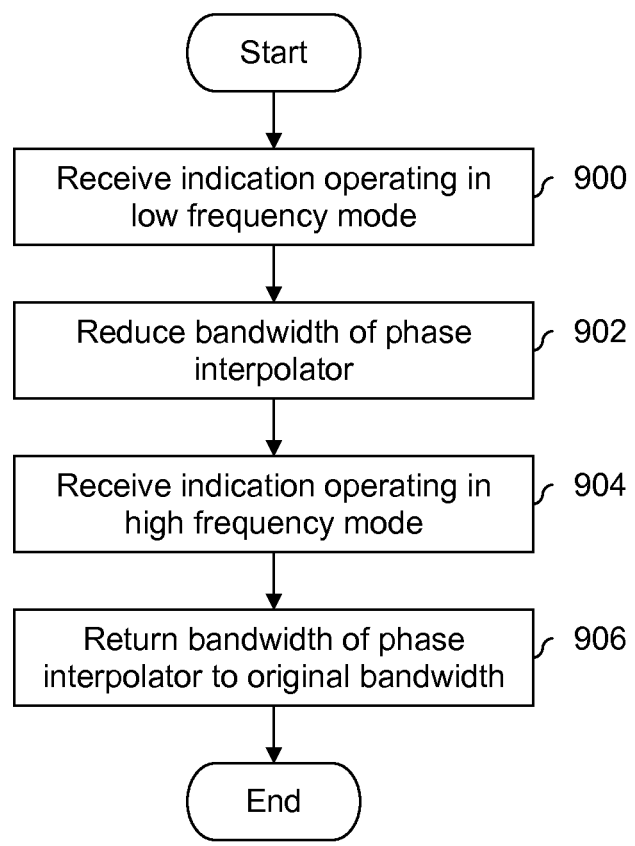
FIG. 9 is a flowchart illustrating an embodiment of a process for configuring a phase interpolator during a low frequency mode of operation.

FIG. 9 is a flowchart illustrating an embodiment of a process for configuring a phase interpolator during a low frequency mode of operation. At 900, an indication is received that operation in a low frequency mode is occurring. For example, based on a desired frequency, a lookup table may be consulted to determine whether to operate in a high frequency mode or a low frequency mode. At 902, the bandwidth of a phase interpolator is reduced. In some embodiments, this is done by reducing the speed (e.g., the rising/falling edge) of a buffer used to mix two signals together. In some embodiments, bandwidth is reduced by lowering a supply voltage used to power the phase interpolator. In some embodiments, bandwidth is reduced by reducing a supply current passed to a phase interpolator.

At 904, an indication is received that operation in a high frequency mode is occurring. For example, a signal with a higher frequency may be desired and the system is reconfigured to operate in a high frequency mode of operation. The bandwidth of the phase interpolator is returned to the original bandwidth at 906. For example, the supply voltage may be returned to its original value.

Figure 10:
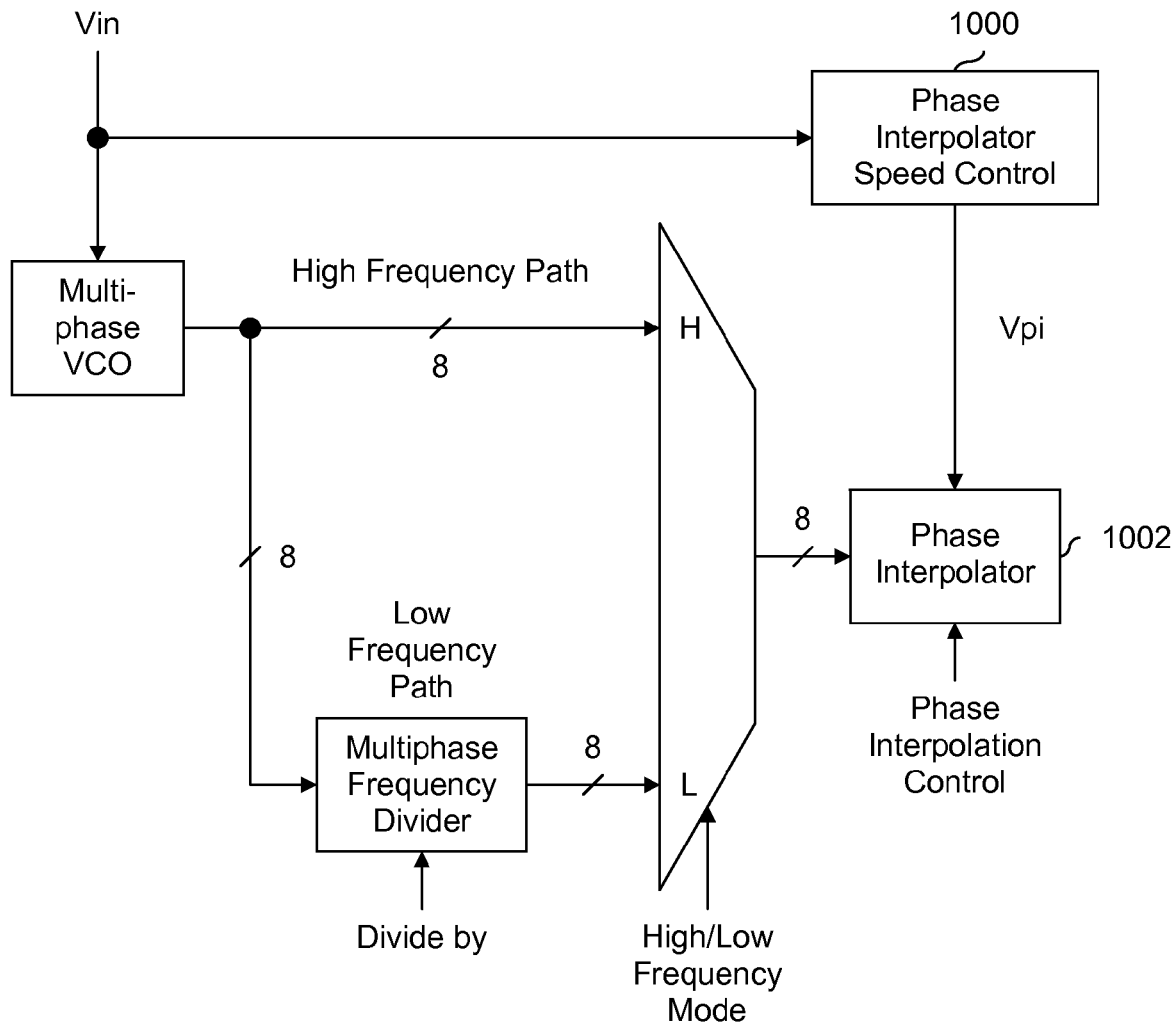
FIG. 10 is a diagram showing an embodiment of a system which includes a phase interpolator speed control module.

FIG. 10 is a diagram showing an embodiment of a system which includes a phase interpolator speed control module. In the example shown, phase interpolator speed control module 1000 is configured to adjust the supply voltage to phase interpolator 1002 during a low frequency mode of operation in order to reduce the bandwidth of the phase interpolator when needed. For example, during a high frequency mode of operation, a first supply voltage is provided to phase interpolator 1002 and during a low frequency mode of operation a second and lower supply voltage is provided.

In this example, Vin relates to the desired voltage and thus phase interpolator speed control module 1000 is able to determine from Vin when the system is operating in a high/low frequency mode of operation and correspondingly when to reduce the supply voltage to phase interpolator 1002. In some embodiments, the value of a desired frequency is provided directly to phase interpolator speed control module 1000 and based on a lookup table, module 1000 knows whether to lower the supply voltage to phase interpolator 1002. In some embodiments, a high/low frequency mode signal is passed to phase interpolator speed control module 1000.

In some embodiments, the circuit shown (or some other embodiment) is used to control the supply voltage to both a phase selector and phase mixer included in a phase interpolator. For example, the supply voltage generated by the circuit shown herein may be used to supply voltage to phase selectors 800 and 802 as well as buffers 804 and 806 in FIG. 8. In some embodiments, reducing a supply voltage to both a phase selector and mixer is desirable because distortions may arise if one has a lower supply voltage but the other does not.

Figure 11:
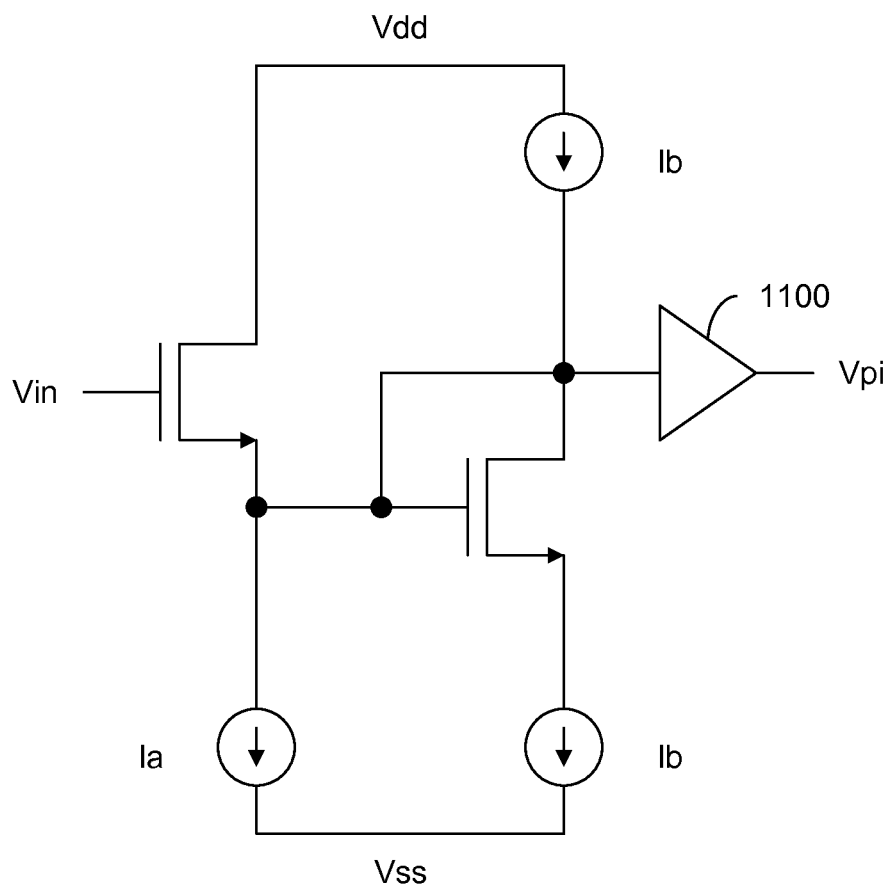
FIG. 11 is a diagram showing an embodiment of a phase interpolator speed control module which generates a supply voltage for a phase interpolator.

FIG. 11 is a diagram showing an embodiment of a phase interpolator speed control module which generates a supply voltage for a phase interpolator. In some embodiments, phase interpolator speed control module 1000 in FIG. 10 is implemented as shown. Vin is an input voltage also passed to a multiphase VCO and therefore Vin is related to a desired frequency. Using the voltage Vin, a supply voltage Vpi is generated which is provided to a phase interpolator. In some embodiments, there is a feedback path from the output of buffer 1100 to the input of buffer 1100.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for generating a signal having a desired frequency and a desired phase, comprising:
   determining whether to operate in a high or low frequency mode of operation;
   in the event it is determined to operate in the high frequency mode of operation:
      using a multiphase voltage-controlled oscillator (VCO) to generate a first plurality of signals, wherein each of the first plurality of signals has the desired frequency and each of the first plurality of signals has a different phase;
      using a multiplexer to select the first plurality of signals from the multiphase VCO to pass to a phase interpolator; and
      using the phase interpolator to generate the signal at the desired frequency and the desired phase using the first plurality of signals; and
   in the event it is determined to operate in the low frequency mode of operation:
      using the multiphase VCO to generate a second plurality of signals, wherein each of the second plurality of signals has a frequency which is a multiple of the desired frequency and each of the second plurality of signals has a different phase;
      using a multiphase frequency divider to generate a third plurality of signals by dividing the frequency of the second plurality of signals down to the desired frequency while maintaining a phase relationship associated with the second plurality of signals;
      using the multiplexer to select the third plurality of signals from the multiphase frequency divider to pass to the phase interpolator; and
      using the phase interpolator to generate the signal at the desired frequency and the desired phase using the third plurality of signals.

2. The method of claim 1, wherein determining whether to operate in a high or low frequency mode of operation includes comparing the desired frequency to a threshold.

3. The method of claim 1, wherein determining whether to operate in a high or low frequency mode of operation includes accessing a lookup table and using the lookup table in the determination.

4. The method of claim 1, wherein using the multiphase frequency divider includes performing a divide by $2^k$, where k is an integer.

5. The method of claim 1, wherein:
   the multiphase frequency divider is capable of performing frequency division by a plurality of divisors; and
   the method further includes in the event it is determined to operate in the low frequency mode of operation:
      using a lookup table to determine what divisor to configure the multiphase frequency divider to use when performing frequency division.

6. The method of claim 5, wherein determining what divisor to configure the multiphase frequency divider to use includes accessing a lookup table based on the desired frequency.

7. The method of claim 5, wherein determining what divisor to configure the multiphase frequency divider to use is based on one or more of the following: power consumption, noise, desired signal characteristics or desired load.

8. The method of claim 1 further comprising in the event it is determined to operate in a low frequency mode of operation, reducing the bandwidth of the phase interpolator.

9. The method of claim 8, wherein reducing the bandwidth of the phase interpolator includes one or more of the following: reducing a supply voltage to the phase interpolator, reducing a supply current to the phase interpolator, reducing a rise time associated with the phase interpolator or reducing a fall time associated with the phase interpolator.

10. The method of claim 1, wherein the method is performed by one or more of the following: an application-specific integrated circuit (ASIC), field-programmable gate array (FPGA) or an embedded microprocessor.

11. The method of claim 1, wherein the signal at the desired frequency and the desired phase is used to process a signal stored in storage media.

12. The method of claim 1, wherein the signal at the desired frequency and the desired phase is used to process a signal exchanged over a communication channel.

13. A system for generating a signal having a desired frequency and a desired phase, comprising:
   a controller configured to determine whether to operate in a high or low frequency mode of operation;
   a multiphase voltage-controlled oscillator (VCO) to configured to:
      in the event it is determined to operate in the high frequency mode of operation, generate a first plurality of signals, wherein each of the first plurality of signals has the desired frequency and each of the first plurality of signals has a different phase; and
      in the event it is determined to operate in the low frequency mode of operation, generate a second plurality of signals, wherein each of the second plurality of signals has a frequency which is a multiple of the desired frequency and each of the second plurality of signals has a different phase;
   a multiphase frequency divider to configured to in the event it is determined to operate in a low frequency mode of operation, generate a third plurality of signals by dividing the frequency of the second plurality of signals down to the desired frequency while maintaining a phase relationship associated with the second plurality of signals;
   a multiplexer configured to:
      in the event it is determined to operate in the high frequency mode of operation, select the first plurality of signals from the multiphase VCO to pass to a phase interpolator; and
      in the event it is determined to operate in the low frequency mode of operation, select the third plurality of signals from the multiphase frequency divider to pass to the phase interpolator; and
   the phase interpolator configured to:
      in the event it is determined to operate in the high frequency mode of operation, generate the signal at the desired frequency and the desired phase using the first plurality of signals; and
      in the event it is determined to operate in the low frequency mode of operation, generate the signal at the desired frequency and the desired phase using the third plurality of signals.

14. The system of claim 13, wherein the controller is configured to determine whether to operate in a high or low frequency mode of operation by comparing the desired frequency to a threshold.

15. The system of claim 13, wherein the controller is configured to determine whether to operate in a high or low frequency mode of operation by accessing a lookup table and using the lookup table in the determination.

16. The system of claim 13, wherein the multiphase frequency divider is further configured to perform a divide by $2^k$, where k is an integer.

17. The system of claim 13, wherein:
the multiphase frequency divider is capable of performing frequency division by a plurality of divisors; and
the system further includes a lookup table configured to in the event it is determined to operate in the low frequency mode of operation:
determine what divisor to configure the multiphase frequency divider to use when performing frequency division.

18. The system of claim 17, wherein determining what divisor to configure the multiphase frequency divider to use includes accessing a lookup table based on the desired frequency.

19. The system of claim 17, wherein determining what divisor to configure the multiphase frequency divider to use is based on one or more of the following: power consumption, noise, desired signal characteristics or desired load.

20. The system of claim 13, wherein the controller is further configured to in the event it is determined to operate in a low frequency mode of operation, reduce the bandwidth of the phase interpolator.

21. The system of claim 20, wherein the controller is configured to reduce the bandwidth of the phase interpolator by one or more of the following: reducing a supply voltage to the phase interpolator, reducing a supply current to the phase interpolator, reducing a rise time associated with the phase interpolator or reducing a fall time associated with the phase interpolator.

22. The system of claim 13, wherein the system includes one or more of the following: an application-specific integrated circuit (ASIC), field-programmable gate array (FPGA) or an embedded microprocessor.

23. The system of claim 13, wherein the signal at the desired frequency and the desired phase is used to process a signal stored in storage media.

24. The system of claim 13, wherein the signal at the desired frequency and the desired phase is used to process a signal exchanged over a communication channel.

* * * * *